US008314616B2

(12) United States Patent
Hughes et al.

(10) Patent No.: US 8,314,616 B2
(45) Date of Patent: Nov. 20, 2012

(54) MAGNETIC RESONANCE METHOD AND APPARATUS FOR DETERMINING THE MAGNETIZATION TRANSFER CONSTANT IN SPIN ECHO IMAGING SEQUENCES

(75) Inventors: Timothy Hughes, Erlangen (DE); Tallal Charles Mamisch, Zurich (CH)

(73) Assignees: Siemens Aktiengesellschaft, Munich (DE); Inselspital-Stiftung, Bern (CH)

( * ) Notice: Subject to any disclaimer, the term of this patent is extended or adjusted under 35 U.S.C. 154(b) by 365 days.

(21) Appl. No.: 12/704,693

(22) Filed: Feb. 12, 2010

(65) Prior Publication Data

US 2010/0207628 A1 Aug. 19, 2010

(30) Foreign Application Priority Data

Feb. 13, 2009 (DE) .................... 10 2009 008 795

(51) Int. Cl.
*G01V 3/00* (2006.01)
(52) U.S. Cl. ...................... 324/307; 324/314
(58) Field of Classification Search .............. 324/307, 324/309, 306, 314, 312; 600/410
See application file for complete search history.

(56) References Cited

U.S. PATENT DOCUMENTS

| 5,050,609 A * | 9/1991 | Balaban et al. ............... 600/410 |
| 5,270,652 A | 12/1993 | Dixon et al. |
| 5,682,891 A * | 11/1997 | Sonoki et al. ................. 600/410 |
| 7,634,302 B2 * | 12/2009 | Gupta et al. .................. 600/410 |
| 2004/0059213 A1 | 3/2004 | Kassai et al. |
| 2008/0021306 A1 | 1/2008 | Van Zijl et al. |
| 2009/0167303 A1 | 7/2009 | Eliav et al. |

OTHER PUBLICATIONS

"On the Origin of Apparent Low Tissue Signals in Balanced SSFP," Bieri et al., Magnetic Resonance in Medicine, vol. 56,( 2006), pp. 1067-1074.
"Magnetization Transfer Contrast (MTC)—Welches ist die MTC-sensitivste MRT-Sequenz?" Vahlensieck et al., Fortschr. Röntgenstr., vol. 169.2 (1998) pp. 195-197.
"Magnetization Transfer in MRI: A Review," Henkelman et al., NMR in Biomedicine, vol. 14 (2001) pp. 57-64.
"Variable-Rate Selective Excitation," Conolly et al., Journal of Magnetic Resonance, vol. 78 (1988) pp. 440-458.

* cited by examiner

*Primary Examiner* — Louis Arana
(74) *Attorney, Agent, or Firm* — Schiff Hardin LLP

(57) ABSTRACT

In a magnetic resonance method and apparatus for determining a magnetization transfer constant a first MR signal sequence is acquired from an object being examined using a spin echo based imaging sequence, a second MR signal sequence is acquired from the object being examined using a spin echo based imaging sequence having basically identical imaging parameters to the first MR signal sequence, with the exception that the energy level of the RF pulses for exciting the magnetization in the first MR signal sequence and the energy level of the RF pulses for exciting the magnetization in the second MR signal sequence are different. The magnetization transfer constant is determined based on the signal differences between the first and second MR signal sequences.

7 Claims, 2 Drawing Sheets

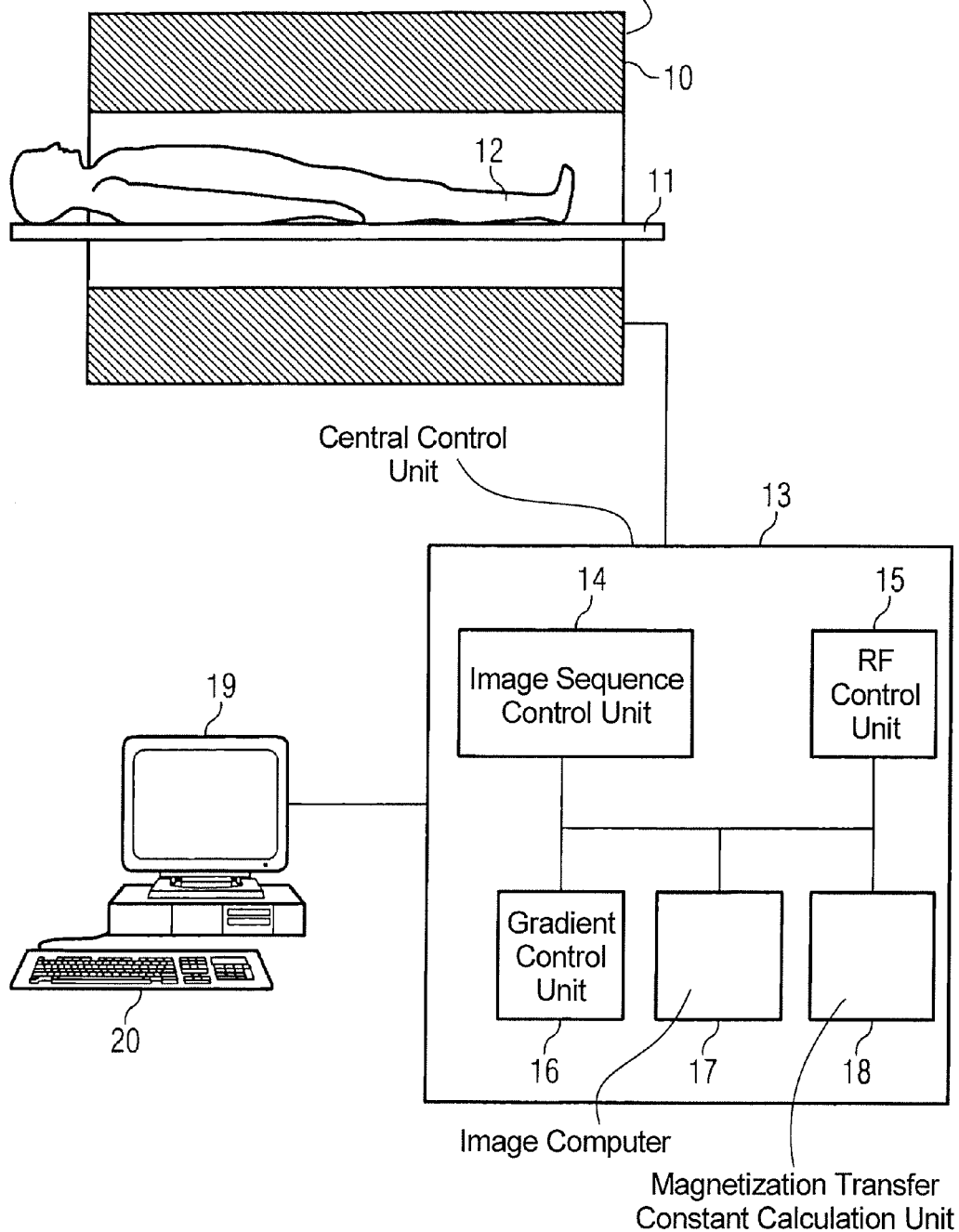

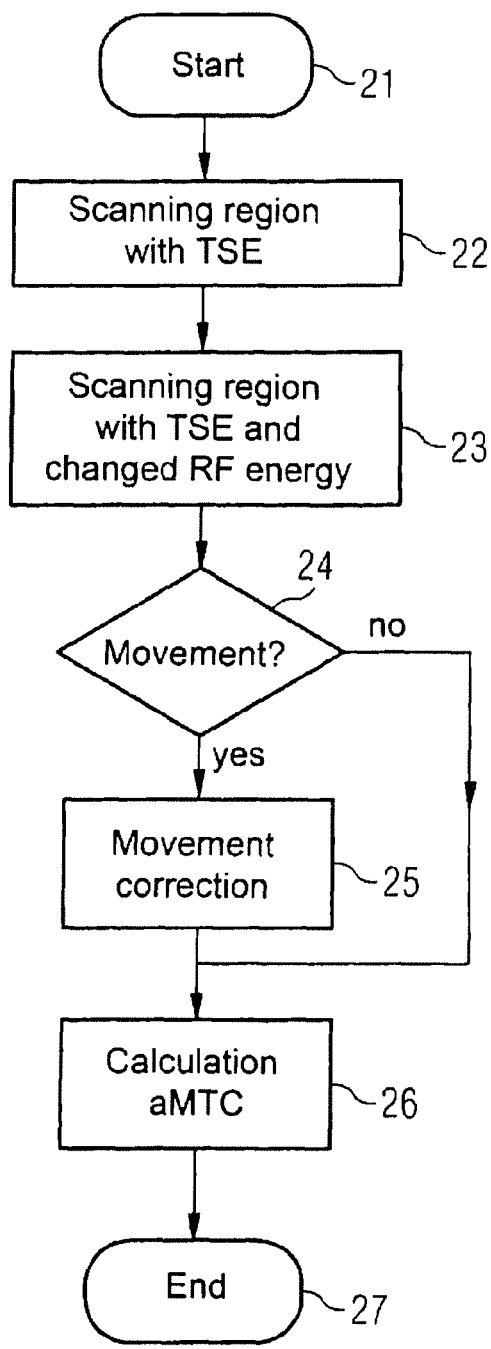

MAGNETIC RESONANCE METHOD AND APPARATUS FOR DETERMINING THE MAGNETIZATION TRANSFER CONSTANT IN SPIN ECHO IMAGING SEQUENCES

BACKGROUND OF THE INVENTION

1. Field of the Invention

The present invention concerns a method for determining the magnetization transfer constant for spin echo magnetic resonance imaging sequences, and a magnetic resonance imaging apparatus that implements such a method.

2. Description of the Prior Art

The magnetization transfer is based on the fact that an interaction takes place between the water protons and other protons that are bonded in macromolecules. Upon the excitation of the protons in the macromolecules by an RF pulse, the saturation of these other protons is transferred to the water protons. In MR imaging, this transference of the magnetization can be observed as a weakened signal from the water protons, the weakening being dependant on the magnetization transfer. The calculation of a magnetization transfer coefficient is important in several clinical problems with regard to brain imaging, mammography, and in examinations of cartilage, as examples. Typically, the magnetization transfer coefficient (MTC) is calculated from data acquisitions done with a special magnetization transfer saturation pulse, which is emitted at a frequency outside of that of the water proton resonance, in order to saturate the longitudinal magnetization of the protons in the macromolecules (see Henkelmann R. M. et al, "Magnetisation Transfer in MRI: A review", NWR Biomedicine 14, 57-64). This type of calculation requires a lengthy scanning period, which affects usage of the apparatus during the clinical routine.

SUMMARY OF THE INVENTION

An object of the present invention is to provide a method and a magnetic resonance apparatus wherein the magnetization transfer constant can be calculated easily, and within a reasonable period of time.

In accordance with a first aspect of the invention, a method for determining the magnetization transfer constant includes, in a first step an MR signal sequence of an object being examined is acquired with a spin echo-based imaging sequence. Furthermore, a second MR signal sequence of the object being examined is acquired with a spin echo-based imaging sequence, with the imaging parameters being basically identical in both imaging sequences. The imaging parameters differ only in that the energy level of the RF pulse for exciting the magnetization in the first MR signal sequence is different from that in the second MR signal sequence. A magnetization transfer constant can then be determined using the signal difference between the first and second MR signal sequences. By using two identical imaging sequences, which differ only in the energy levels of the radiated RF signals, signal differences in the acquisition (detection) of the MR signals for the two signal sequences can be traced back to the magnetization transfer.

Ideally, the first signal sequence and the second signal sequence are acquired with a fast spin echo imaging sequence wherein, after generating a spin echo through a 90°, 180° pulse sequence by alternating several 180° pulses, numerous spin echoes are read out. The use of a spin echo sequence, or rather a fast spin echo sequence, has the advantage that the magnetization transfer effect is very strongly pronounced. Furthermore, the contrast of the tissues in the MR image is generally good with fast spin echo sequences.

The different energy levels of the RF pulses for the acquisition of the two signal sequences can be obtained, for example, with the use of different VERSE (variable rate selective excitation) pulses. With these pulses, a temporally variable gradients wave and a modified RF wave are used. These types of VERSE pulses are described, for example, in Conolly S., Nishimura D. G., Macoviski A., Glover G., "Variable-rate selective excitation" J. Magn. Reson. 1988; 78: 440-458. Another possibility for generating different RF energy levels is to select different temporal bandwidths of the pulses for the first and second signal sequences. It is also possible to vary the temporal length of the pulses. Moreover, the above mentioned methods may be combined in order to generate different RF pulse energy levels for the two signal sequences.

Ideally, MR images are obtained from the two signal sequences, with the differences of the signals being calculated for image points. The signal differences can then be used to calculate an apparent magnetization transfer constant aMTC, with aMTC=(S2−S1)/S2, wherein S2 is the MR signal of the second MR image from the second MR signal sequence and S1 is the MR signal from the first MR image of the first MR signal sequence.

From the signal difference determined from image points, a map of the magnetization transfer constant for the object being examined can be calculated. With an image point-based determination of the signal difference, ideally, movement of the object being examined between the two scans is determined and taken into account in calculating the signal difference. This can be accomplished for example, by comparing the computed MR images and registering the two images before the calculation of the signal difference is carried out, which means that it will be checked to see if the object being examined has moved in a manner such as translation, rotation or shearing between the two recordings of the MR images. This movement can be corrected in the images, in order that identical tissues may be compared, rather than non-identical tissues of different regions of the object being examined.

The invention also encompasses a magnetic resonance imaging apparatus for determining the magnetization transfer constant, that includes an MR data acquisition unit for acquiring the first spin echo imaging sequence and the second spin echo imaging sequence. The apparatus also includes a computer unit that calculates the signal difference between the first and second MR signal sequences.

BRIEF DESCRIPTION OF THE DRAWINGS

FIG. 1 schematically illustrates a magnetic resonance imaging apparatus that calculates a magnetization transfer constant in accordance with the invention.

FIG. 2 is a flowchart showing the basic steps for calculating a magnetization transfer constant in an embodiment of the method according to the invention.

DESCRIPTION OF THE PREFERRED EMBODIMENTS

In FIG. 1, an MRI apparatus is shown, with which a magnetization transfer constant can be easily and quickly calculated. The MRI apparatus has a scanner 10 in which a polarization field B0 is generated. A person to be examined 12 on a table 11 is transported to the center of the scanner 10, so a resulting magnetization in the patient 12 in the direction of the B0 field occurs. By irradiating the patient 12 with RF pulses and alternating magnetic field gradients, MR images can be generated. The basic operation of an MRI scanner is familiar to those skilled in the field, and need not be explained further herein. Additionally, a central control unit 13 controls the sequence of the examination. The central control unit 13 contains an image sequence control unit 14 that after an operator enters the individual imaging parameters for the imaging sequence, i.e. the sequence for alternating the magnetic field gradients, controls the RF pulse generation and the signal acquisition. For controlling the RF pulses, there is an RF control unit 15 that controls the generation of RF pulses and the irradiation of the object being examined. In the present case, the RF control unit 15 controls the irradiation of RF pulses such that with two different spin echo imaging sequences, different RF energy levels are used, which will be explained in detail in the following. A gradients control unit 16 controls the alternating of the magnetic field gradients, which are necessary for the spatial encoding of the excited spins. An image computer 17 can then process the MR signals received from a receiving coil (not shown), and construct MR images, as is known. A calculation unit 18 can calculate the magnetization transfer constant based on the signal differences that occur between acquisition of a first MR signal (data set) with a fast spin echo sequence and a second MR signal with a second fast MR spin echo imaging sequence. In the embodiment shown, the units 17 and 18 are illustrated as separate units. It is understood that these units 17 and 18 may be combined in a single unit, which calculates both the MR images and the signal differences as well, as will be explained in detail later.

Furthermore, there is a display device 19 for displaying the MR images and an input device 20 with which an operator can control the MRI scanner.

For calculating the magnetization transfer constant, the image sequence control unit 14 is operated such that MR signals of a subject 12 at a predetermined region are acquired with a fast spin echo sequence, a so-called turbo spin echo sequence. Furthermore, a second MR spin echo sequence with identical imaging parameters is acquired for the identical examination region. The first imaging sequence and the second imaging sequence differ however, in that the RF energy level for exciting the magnetization is different for each sequence. This results in different signals in the MR images in the case of a magnetization transfer. As an example, the different RF energy levels may be obtained by using RF pulses with different VERSE factors and/or with different temporal bandwidths for each pulse sequence.

In FIG. 2, the steps are schematically shown that are executed to calculate a magnetization transfer constant aMTC. After beginning the process in step 21, in step 22 a first turbo spin echo imaging sequence of a predetermined region, such as a joint where cartilage is displayed, is executed. The same imaging sequence is repeated in step 23, whereby however, the RF energy level used in step 23 for exciting the magnetization is different from the RF energy level used in the recording of the sequence in step 22. In step 24, it is checked as to whether the subject has moved between the two recordings made in steps 22 and 23. If this is the case, this movement must be corrected, in order to ascertain that the same tissues are compared in the calculation of a magnetization transfer constant at image points. This can be done with a movement correction in step 25, wherein it is ascertained that the examination region is basically shown with the same image points in the MR images in each case. The calculation of the magnetization transfer constant can be carried out in the image by establishing a difference between the MR signal that was acquired in step 22 and the MR signal that was acquired in step 23, at the image point level. The magnetization constant aMTC can then be calculated in step 26, according to the formula aMTC=(S1−S2)/S2.

S2 represents the MR signal at an image point in the second turbo spin echo sequence and S1 is the MR signal in the first turbo spin echo imaging sequence (step 26). The RF energy level in the imaging sequence in step 23 may be higher or lower than the RF energy level of the imaging in step 22. It is only important that the two imaging sequences do not use the same RF energy level.

The method is complete at step 27. In summary, the present invention allows for an easy and fast calculation of a magnetization transfer constant.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining a magnetization transfer constant in magnetic resonance imaging, comprising the steps of:
    with a magnetic resonance data acquisition unit, acquiring a first magnetic resonance signal sequence from an object using a spin echo imaging sequence;
    with said magnetic resonance apparatus, acquiring a second magnetic resonance signal sequence from said object using a spin echo imaging sequence substantially identical to the spin echo imaging sequence used to acquire said first magnetic resonance signal sequence, but differing with regard to an energy level of RF pulses radiated to excite magnetization in the object is different than the energy level for exciting the magnetization in the second magnetic resonance signal sequence; and
    in a processor, automatically determining the magnetization transfer constant for the object from a signal difference between said first and second magnetic resonance signal sequences.

2. A method as claimed in claim 1 comprising acquiring each of said first and second magnetic resonance signal sequences with a fast spin echo imaging sequence.

3. A method as claimed in claim 1 comprising causing said energy level to be different for acquiring said first and second magnetic resonance signal sequences, respectively, by a technique selected from the group consisting of using different VERSE RF pulses, using RF pulses with different temporal bandwidths, and using different pulse periods for exciting the magnetization for the first and second magnetic resonance signal sequences, respectively.

4. A method as claimed in claim 1 comprising, in said processor, reconstructing a first magnetic resonance image from said first magnetic resonance signal sequence, and reconstructing a second magnetic resonance image from said second magnetic resonance signal sequence, each of said first and second magnetic resonance images being comprised of image points, and determining said signal difference by comparing respective image points of said first and second magnetic resonance signal sequences.

5. A method as claimed in claim 4 comprising, from the signal difference of the respective image points of said first and second magnetic resonance images, calculating a map of the magnetization transfer constant for said object.

6. A method as claimed in claim 1 comprising, in said processor, determining any movement of said object between acquisition of said first and second signal sequences, and automatically taking said movement into account in calculating said signal difference.

7. A magnetic resonance apparatus for determining a magnetization transfer constant in magnetic resonance imaging, comprising:

a magnetic resonance data acquisition unit;

a control unit configured to operate said magnetic resonance data acquisition unit to acquire a first magnetic resonance signal sequence from an object using a spin echo imaging sequence;

said control unit being configured to operate said magnetic resonance apparatus to acquire a second magnetic resonance signal sequence from said object using a spin echo imaging sequence substantially identical to the spin echo imaging sequence used to acquire said first magnetic resonance signal sequence, but differing with regard to an energy level of RF pulses radiated to excite magnetization in the object is different than the energy level for exciting the magnetization in the second magnetic resonance signal sequence; and a processor configured to automatically determine the magnetization transfer constant for the object from a signal difference between said first and second magnetic resonance signal sequences.

* * * * *